United States Patent
Yin et al.

(10) Patent No.: US 12,219,270 B2
(45) Date of Patent: Feb. 4, 2025

(54) IMAGE SENSING DEVICE

(71) Applicant: Guangzhou Tyrafos Semiconductor Technologies Co., Ltd., Guangzhou (CN)

(72) Inventors: Ping-Hung Yin, Hsinchu (TW); Jia-Shyang Wang, Miaoli County (TW); Yu Hsiang Wang, Hsinchu (TW)

(73) Assignee: Guangzhou Tyrafos Semiconductor Technologies Co., Ltd., Guangzhou (CN)

( * ) Notice: Subject to any disclaimer, the term of this patent is extended or adjusted under 35 U.S.C. 154(b) by 167 days.

(21) Appl. No.: 18/143,084

(22) Filed: May 4, 2023

(65) Prior Publication Data
US 2023/0388655 A1 Nov. 30, 2023

Related U.S. Application Data

(60) Provisional application No. 63/345,920, filed on May 26, 2022.

(51) Int. Cl.
*H04N 25/10* (2023.01)
*G06T 3/4015* (2024.01)
(Continued)

(52) U.S. Cl.
CPC ........... *H04N 25/10* (2023.01); *G06T 3/4015* (2013.01); *G06T 5/50* (2013.01); *H01L 27/0255* (2013.01);
(Continued)

(58) Field of Classification Search
CPC ........ H04N 23/13; H04N 23/45; H04N 23/52; H04N 23/56; H04N 23/70; H04N 23/73; H04N 23/74; H04N 23/741; H04N 23/75; H04N 23/76; H04N 23/815; H04N 23/951; H04N 25/10; H04N 25/11; H04N 25/134; H04N 25/135; H04N 25/47; H04N 25/50; H04N 25/533; H04N 25/535; H04N 25/58; H04N 25/583; H04N 25/59; H04N 25/75;
(Continued)

(56) References Cited

U.S. PATENT DOCUMENTS 9,894,304 B1 * 2/2018 Smith ................... H04N 23/843
2022/0123033 A1 * 4/2022 Park ................... H01L 27/14605

* cited by examiner

*Primary Examiner* — Twyler L Haskins
*Assistant Examiner* — Akshay Trehan
(74) *Attorney, Agent, or Firm* — Lin & Associates Intellectual Property, Inc.

(57) ABSTRACT

The present invention relates to an image sensing device comprising: an image sensing array and an image processing circuit. The image sensing array includes sensing units, and the sensing units respectively generate multiple pieces of pixel data. The multiple pieces of pixel data are generated according to different frame rates under different exposure periods, and include a first pixel data of a first subframe and a second pixel data of a second subframe. The first pixel data is generated by exposing a first exposure period for a first frame rate, and the second pixel data is generated by exposing a second exposure period for a second frame rate. The first frame rate is less than the second frame rate. The first exposure period is greater than the second exposure period, and multiple pieces of the second pixel data are generated during one image capturing operation.

15 Claims, 14 Drawing Sheets

(51) Int. Cl.
*G06T 5/50* (2006.01)
*H01L 27/02* (2006.01)
*H01L 27/146* (2006.01)
*H04N 7/01* (2006.01)
*H04N 23/13* (2023.01)
*H04N 23/45* (2023.01)
*H04N 23/52* (2023.01)
*H04N 23/56* (2023.01)
*H04N 23/70* (2023.01)
*H04N 23/73* (2023.01)
*H04N 23/74* (2023.01)
*H04N 23/741* (2023.01)
*H04N 23/75* (2023.01)
*H04N 23/76* (2023.01)
*H04N 23/80* (2023.01)
*H04N 23/951* (2023.01)
*H04N 25/11* (2023.01)
*H04N 25/13* (2023.01)
*H04N 25/47* (2023.01)
*H04N 25/50* (2023.01)
*H04N 25/533* (2023.01)
*H04N 25/535* (2023.01)
*H04N 25/58* (2023.01)
*H04N 25/583* (2023.01)
*H04N 25/59* (2023.01)
*H04N 25/75* (2023.01)
*H04N 25/77* (2023.01)
*H04N 25/771* (2023.01)
*H04N 25/78* (2023.01)

(52) U.S. Cl.
CPC .. *H01L 27/14605* (2013.01); *H01L 27/14612* (2013.01); *H01L 27/14643* (2013.01); *H04N 7/0127* (2013.01); *H04N 23/13* (2023.01); *H04N 23/45* (2023.01); *H04N 23/52* (2023.01); *H04N 23/56* (2023.01); *H04N 23/70* (2023.01); *H04N 23/73* (2023.01); *H04N 23/74* (2023.01); *H04N 23/741* (2023.01); *H04N 23/75* (2023.01); *H04N 23/76* (2023.01); *H04N 23/815* (2023.01); *H04N 23/951* (2023.01); *H04N 25/11* (2023.01); *H04N 25/134* (2023.01); *H04N 25/135* (2023.01); *H04N 25/47* (2023.01); *H04N 25/50* (2023.01); *H04N 25/533* (2023.01); *H04N 25/535* (2023.01); *H04N 25/58* (2023.01); *H04N 25/583* (2023.01); *H04N 25/59* (2023.01); *H04N 25/75* (2023.01); *H04N 25/77* (2023.01); *H04N 25/771* (2023.01); *H04N 25/78* (2023.01); *G06T 2207/20208* (2013.01); *G06T 2207/20221* (2013.01)

(58) Field of Classification Search
CPC ...... H04N 25/77; H04N 25/771; H04N 25/78; H04N 7/0127; G06T 3/4015; G06T 5/50; G06T 2207/20208; G06T 2207/20221; H01L 27/0255; H01L 27/14605; H01L 27/14612; H01L 27/14643
See application file for complete search history.

| 111 | T1 (F1) | | Rdo | T1 (F1) | |
|---|---|---|---|---|---|
| 112 | T2 (F2) | | Rdo | T2 (F2) | |
| 113 | T3 (F3) | Rdo | | T3 (F3) | Rdo |
| 114 | T4 (F4) | Rdo | | T4 (F4) | Rdo |

FIG. 7

IMAGE SENSING DEVICE

CROSS-REFERENCE TO RELATED APPLICATION

This application claims priority of U.S. provisional application No. 63/345,920, filed on May 26, 2022, the content of which is incorporated herein in its entirety by reference.

BACKGROUND OF THE INVENTION

1. Field of the Invention

The present invention relates generally to an image sensing device, in particular, in particular to an image sensing device capable of generating high dynamic range (HDR) images in a short period of time.

2. The Prior Arts

In recent years, the demand of the self-driving car industry has become increasingly vigorous. For self-driving cars, an image sensor for detecting real-time road conditions is an essential component. The dynamic vision sensor (DVS) is a mainstream image sensor used for detecting real-time road conditions. The reason is that the DVS records images in units of events. This dynamic event-based sensor brings machine autonomy closer to reality, making it suitable for vision-based high-speed applications in the field of autonomous vehicles.

However, during road driving, occasional situations where the illumination level changes sharply in a short period of time may occasionally cause the problem of partial (or all) temporary overexposure (or underexposure) of the image sensor. During this short period of time, due to the insufficient details in the images, the image recognition algorithm of the self-driving car cannot make correct object detection, thus increasing the risk of accidents.

HDR imaging is an imaging technique generally concerned with allowing the capture and representation of a large dynamic range of illuminance between the brightest and darkest regions of an image (compared to standard digital imaging techniques). Wider dynamic range allows HDR images to more accurately represent the wide range of intensity levels seen in real-world scenes. One method for capturing HDR images involves the merging of multiple independently captured photographs. For example, this processing procedure may include successively capturing multiple images at different exposures, and then processing the images to generate a composite HDR image.

However, the process of generating HDR images from multiple independently captured images has drawbacks. For example, when merging multiple independently captured images, generally multiple images with shorter exposure periods are superimposed to obtain a better image. However, when the image is in a low-light environment, the image with a short exposure period cannot receive any signal during the short exposure period, resulting in the failure to generate a HDR image after merging the images. In addition, in the past, when multiple images were captured continuously at different exposures, it was limited by the need to wait for the image with the longest exposure period to be generated before merging, which made it impossible to generate HDR images in a short period of time.

Therefore, the present invention is proposed to address the above-mentioned deficiency.

SUMMARY OF THE INVENTION

A primary objective of the present invention is provide an image sensing device which generate multiple pieces of pixel data through a plurality of sensing units included in an image sensing array, the multiple pieces of pixel data are generated according to different frame rates under different exposure periods, the multiple pieces of pixel data are generated under different exposure periods, the multiple pieces of pixel data includes a first pixel data of a first sub-frame and a second pixel data of a second sub-frame, the first pixel data is generated by exposing at a first frame rate for a first exposure period, the second pixel data is generated by exposing at a second frame rate for a second exposure period, the first exposure period is greater than the second exposure period, and multiple pieces of the second pixel data are generated during one image capturing operation. Thereby, the image sensing device according to the present invention can realize clear image information under low light source and high brightness, and overcome the limitation that the image fusion time must be shorter than the exposure time, and generate HDR images in a short period of time.

In order to achieve the foregoing objective, the present invention provides an image sensing device, comprising: an image sensing array, includes a plurality of sensing units, the sensing units respectively generate multiple pieces of pixel data, and the multiple pieces of pixel data are generated according to different frame rates under different exposure periods; and an image processing circuit, coupled to the image sensing array, wherein the multiple pieces of pixel data includes a first pixel data of a first sub-frame and a second pixel data of a second sub-frame, and the first pixel data is generated by exposing at a first frame rate for a first exposure period, the second pixel data is generated by exposing at a second frame rate for a second exposure period, the first frame rate is less than the second frame rate, and the first exposure period is greater than the second exposure period, and multiple pieces of the second pixel data are generated during one image capturing operation performed by the image processing circuit, wherein the sensing units can be divided into a plurality of pixel groups, wherein the pixel groups are used to generate a high dynamic range image signal by using the image processing circuit to perform image fusion on the multiple pieces of pixel data according to the different frame rates under the different exposure periods in multiple image capturing operations, wherein the sensing units include a control circuit, and the control circuit includes: a first exposure control circuit, for generating a first transmission signal and a first reset signal; and a second exposure control circuit, for generating a second transmission signal and a second reset signal, and wherein the first exposure control circuit and the second exposure control circuit are independent, and are used to respectively control the different frame rates and the different exposure periods.

In a preferred embodiment of the image sensing device of the present invention, the fusion and output of the high dynamic range image signal are carried out in each image capturing operation, so as to output the high dynamic range image signal as a chromatic high dynamic range image with full resolution, and wherein the high dynamic range image signal is output at a rate greater than or equal to the second frame rate.

In a preferred embodiment of the image sensing device of the present invention, the first exposure period is longer than one frame length of the second sub-frame.

In a preferred embodiment of the image sensing device of the present invention, the sensing units respectively include: a photodiode; a transmission circuit, coupled to the photodiode; a reset circuit, coupled to the photodiode, wherein the reset circuit is used to receive a reset signal, and the transmission circuit is used to receive a transmission signal, the reset circuit resets the charge in the photodiode according to the reset signal, and the transmission circuit converts the charge accumulated in the photodiode into sensing signal according to the transmission signal.

In a preferred embodiment of the image sensing device of the present invention, at least a portion of the sensing units is a first sensing unit, the reset circuit of the first sensing unit receives the first reset signal, and the transmission circuit of the first sensing unit receives the first transmission signal, and the time difference between the first reset signal and the first transmission signal is the first exposure period.

In a preferred embodiment of the image sensing device of the present invention, the sensing units of different pixel groups have the same first exposure period.

In a preferred embodiment of the image sensing device of the present invention, at least a portion of the sensing units is a second sensing unit, the reset circuit of the second sensing unit receives the second reset signal, the transmission circuit of the second sensing unit receives the second transmission signal, and the timing of the second reset signal and the second transmission signal is between the first reset signal and the transmission signal.

In a preferred embodiment of the image sensing device of the present invention, the time difference between the second reset signal and the second transmission signal for each of the sensing units is the second exposure period.

In a preferred embodiment of the image sensing device of the present invention, the sensing units of different pixel groups have the same second exposure period.

In a preferred embodiment of the image sensing device of the present invention, the pixel groups include a red light pixel group, a green light pixel group and a blue light pixel group, the red light pixel group, the green light pixel group, and the blue light pixel group respectively include more than two sensing units with different frame rates and different exposure periods, so that the image processing circuit outputs the high dynamic range image signal after performing fusion on pixel data with different color respectively generated by the pixel groups.

In a preferred embodiment of the image sensing device of the present invention, the image sensing device further comprising a plurality of filters, the filters include a red light filter, a green light filter and a blue light filter, the red light filter, the green light filter, and the blue light filter are correspondingly arranged on the sensing units of the red light pixel group, the green light pixel group, and the blue light pixel group.

In a preferred embodiment of the image sensing device of the present invention, the pixel groups further include an infrared pixel group, and the image processing circuit outputs infrared image information according to image information generated by the infrared pixel group.

In a preferred embodiment of the image sensing device of the present invention, the image sensing device further comprising an infrared filter, the infrared filter is correspondingly disposed on the sensing units of the infrared pixel group.

In a preferred embodiment of the image sensing device of the present invention, the control circuit is coupled to the transmission circuit and the reset circuit, and the control circuit is used to generate the transmission signals and the reset signals.

In a preferred embodiment of the image sensing device of the present invention, the image sensing device further comprising an image frame buffer, which is coupled to the image processing circuit, and the image frame buffer is used to store the pixel data of at least one sub-frame, so as to be used for image fusion In conclusion, the image sensing device of the present invention generates multiple pieces of pixel data through a plurality of sensing units included in an image sensing array, the multiple pieces of pixel data are generated according to different frame rates under different exposure periods, the multiple pieces of pixel data are generated under different exposure periods, the multiple pieces of pixel data includes a first pixel data of a first sub-frame and a second pixel data of a second sub-frame, the first pixel data is generated by exposing at a first frame rate for a first exposure period, the second pixel data is generated by exposing at a second frame rate for a second exposure period, the first exposure period is greater than the second exposure period, and multiple pieces of the second pixel data are generated during one image capturing operation. Thereby, the image sensing device according to the present invention can realize clear image information under low light source and high brightness, and overcome the limitation that the image fusion time must be shorter than the exposure time, and generate HDR images in a short period of time.

In order to make those skilled in the art understand the objectives, characteristics and effects of the present invention, the present invention is described in detail below by the following specific embodiments, and in conjunction with the attached drawings.

BRIEF DESCRIPTION OF THE DRAWINGS

FIG. 7 is a schematic view illustrating an exposure period of a HDR image sensing circuit according to a second embodiment of the present invention;

DETAILED DESCRIPTION OF THE PREFERRED EMBODIMENT

Figure 1:
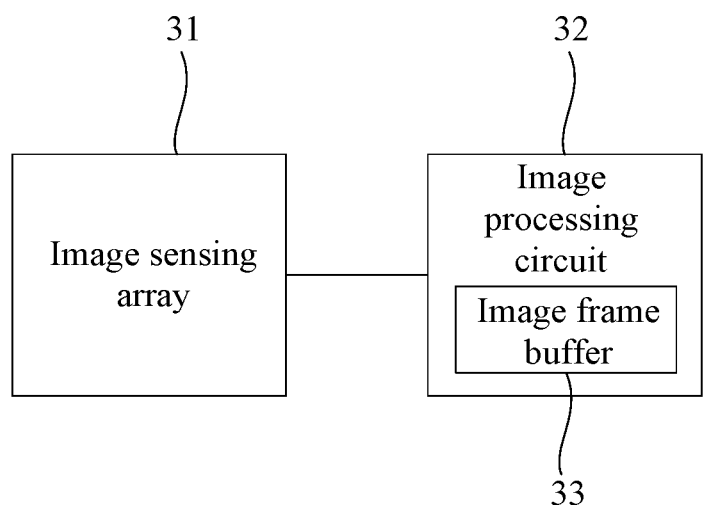
FIG. 1 is a schematic view showing a HDR image sensing circuit according to the present invention.

The inventive concept will be explained more fully hereinafter with reference to the accompanying drawings in which exemplary embodiments of the inventive concept are shown. Advantages and features of the inventive concept and methods for achieving the same will be apparent from the following exemplary embodiments, which are set forth in more details with reference to the accompanying drawings. However, it should be noted that the present inventive concept is not limited to the following exemplary embodiments, but may be implemented in various forms. Accordingly, the exemplary embodiments are provided merely to disclose the inventive concept and to familiarize those skilled in the art with the type of the inventive concept. In the drawings, exemplary embodiments of the inventive concepts are not limited to the specific examples provided herein and are exaggerated for clarity.

The terminology used herein is used to describe particular embodiments only, and is not intended to limit the present invention. As used herein, the singular terms "a" and "the" are intended to include the plural forms as well, unless the context clearly dictates otherwise. As used herein, the term "and/or" includes any and all combinations of one or more of the associated listed items. It will be understood that when an element is referred to as being "connected" or "coupled" to another element, it can be directly connected or coupled to the other element or intervening elements may be present.

Similarly, it will be understood that when an element (e.g., a layer, region, or substrate) is referred to as being "on" another element, it can be directly on the other element or intervening elements may be present. In contrast, the term "directly" means that no intervening elements are present. It should be further understood that when the terms "comprising" and "including" are used herein, it is intended to indicate the presence of stated features, steps, operations, elements, and/or components, but does not exclude one or more other features, steps, operations, elements, components, and/or the presence or addition of groups thereof.

Furthermore, exemplary embodiments in the detailed description are set forth in cross-section illustrations that are idealized exemplary illustrations of the present inventive concepts. Accordingly, the shapes of the exemplary figures may be modified according to manufacturing techniques and/or tolerable errors. Therefore, the exemplary embodiments of the present inventive concept are not limited to the specific shapes shown in the exemplary figures, but may include other shapes that may be produced according to the manufacturing process. The regions illustrated in the figures have general characteristics and are used to illustrate specific shapes of elements. Therefore, this should not be considered limited to the scope of this creative concept.

It will also be understood that, although the terms "first," "second," "third," etc. may be used herein to describe various elements, these elements should not be limited by these terms. These terms are only used to distinguish each element. Thus, a first element in some embodiments could be termed a second element in other embodiments without departing from the teachings of the present creation. Exemplary embodiments of aspects of the present inventive concept illustrated and described herein include their complementary counterparts. Throughout this specification, the same reference numbers or the same designators refer to the same elements.

Furthermore, example embodiments are described herein with reference to cross-sectional and/or planar views, which are illustrations of idealized example illustrations. Accordingly, deviations from the shapes shown, for example, caused by manufacturing techniques and/or tolerances, are expected. Accordingly, the exemplary embodiments should not be considered limited to the shapes of the regions shown herein, but are intended to include deviations in shapes resulting from, for example, manufacturing. Thus, the regions illustrated in the figures are schematic and their shapes are not intended to illustrate the actual shape of a region of a device and are not intended to limit the scope of example embodiments.

Figure 2:
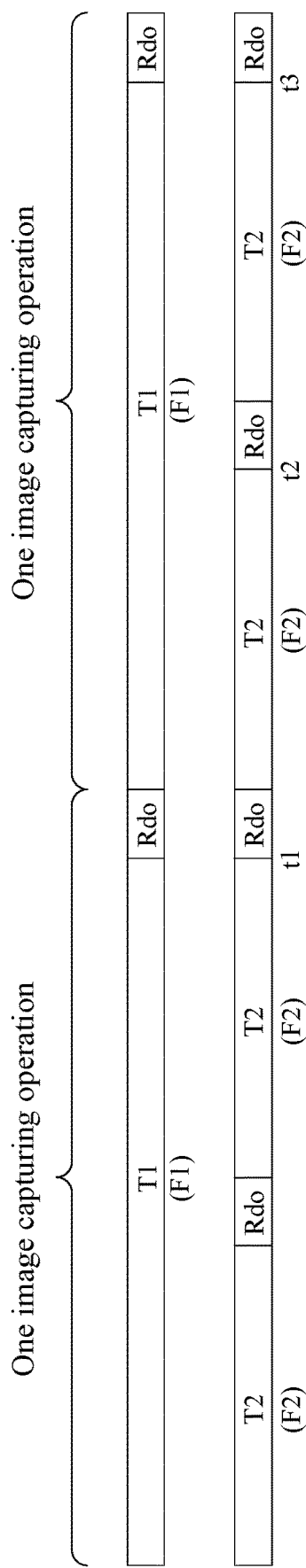
FIG. 2 is a schematic view illustrating an exposure period of a HDR image sensing circuit according to the present invention.

Referring to FIG. 1 and FIG. 2, FIG. 1 is a schematic view of an HDR image sensing device according to the present invention. As shown in FIG. 1, an image sensing device 300 according to the present invention includes: an image sensing array 31 and an image processing circuit 32. The image processing circuit 32 includes an image frame buffer 33.

Specifically, as shown in FIG. 1, the image sensing array 31 according to the present invention is used to generate pixel data. In some embodiments, as shown in FIG. 2, the pixel data are generated according to different exposure periods (T1, T2). Wherein the pixel data includes a first pixel data and a second pixel data, the first pixel data is outputted when an output signal Rdo is generated after a portion of the sensing units of the image sensing array 31 are exposed at a first frame rate F1 for a first exposure period T1, the second pixel data is outputted when the output signal Rdo is generated after another portion of the sensing units of the image sensing array 31 are exposed at a second frame rate F2 for a second exposure period T2. Wherein the first exposure period T1 is longer than the second exposure period T2, and multiple pieces of the second pixel data are generated during one image capturing operation performed by the image processing circuit 32. Wherein the second frame rate F2 is greater than the first frame rate F1, and a first frame length is greater than a second frame length. Here, the frame length refers to the reciprocal of the frame rate. In particular, the first exposure period T1 may be longer than the second frame length. When the image to be sensed is a low-brightness image, and the exposure period of the second sensing unit has been extended to reach the limit of the second frame length, the exposure period of the first sensing unit can also be extended, to perform a longer exposure, thus resulting in an image with higher signal-to-noise ratio (SNR), that is, a better quality image. This is advantageous to image fusion.

It can be understood that, as shown in FIG. 2, since the first exposure period T1 is greater than the second exposure period T2, and the image processing circuit 32 generates multiple pieces of the second pixel data during one image capturing operation, the image processing circuit 32 of the present invention can utilize the image frame buffer 33 to perform image fusion on the pixel data of different exposure periods to generate a real-time HDR image. In this way, the image sensing device 300 according to the present invention can break through the limitation that image fusion must be performed after each imaging operation, and can be performed during each imaging operation, so it can generate real-time HDR image in a short period of time, with better efficiency. Specifically, as shown in FIG. 2, image fusion may be performed at time points t1, t2, and t3. In other words, as long as the first image capture operation is completed, the image processing circuit 32 can perform image fusion every time the output of the second pixel data is completed to generate a real-time HDR image with full resolution.

The First Embodiment

Hereinafter, embodiments of the image sensing circuit of the image sensing device of the present invention will be described with reference to the drawings.

Figure 3:
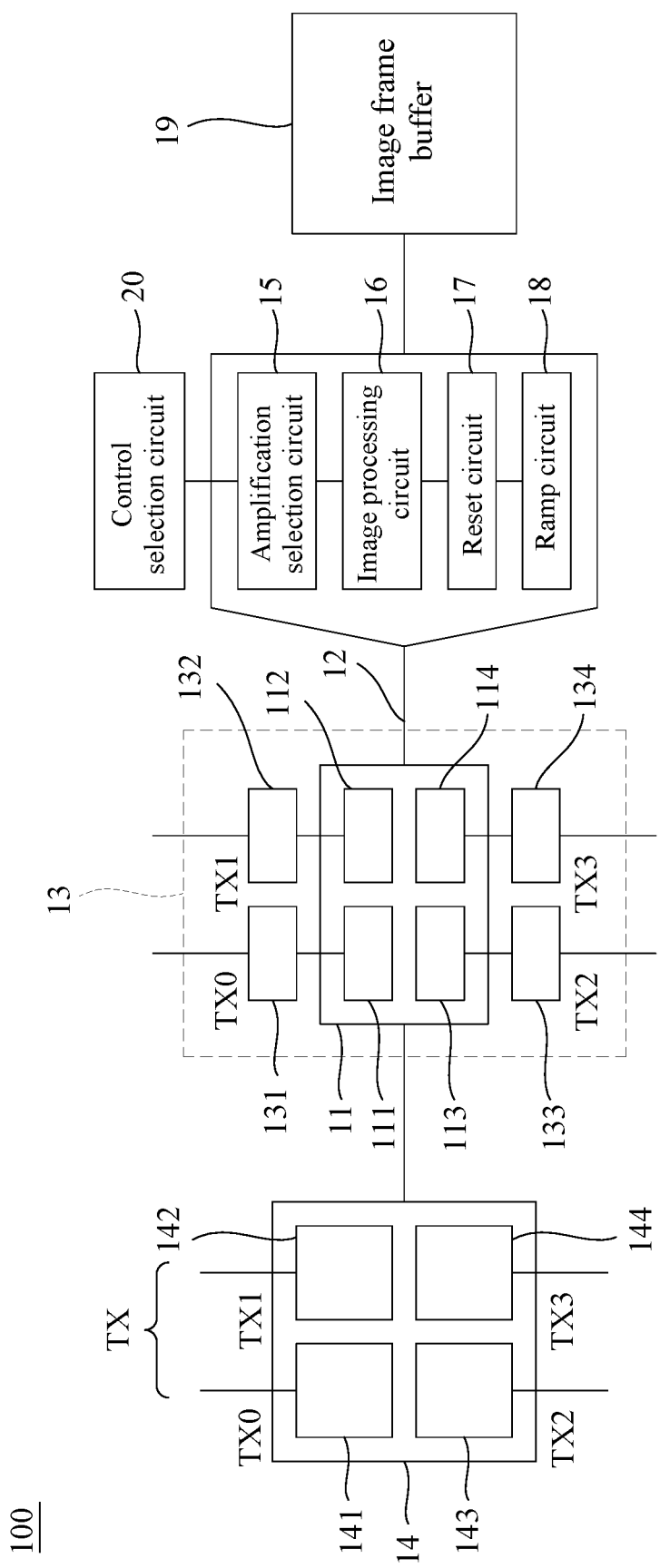
FIG. 3 is a schematic view showing an image sensing circuit according to a first embodiment of the present invention.
Figure 4:
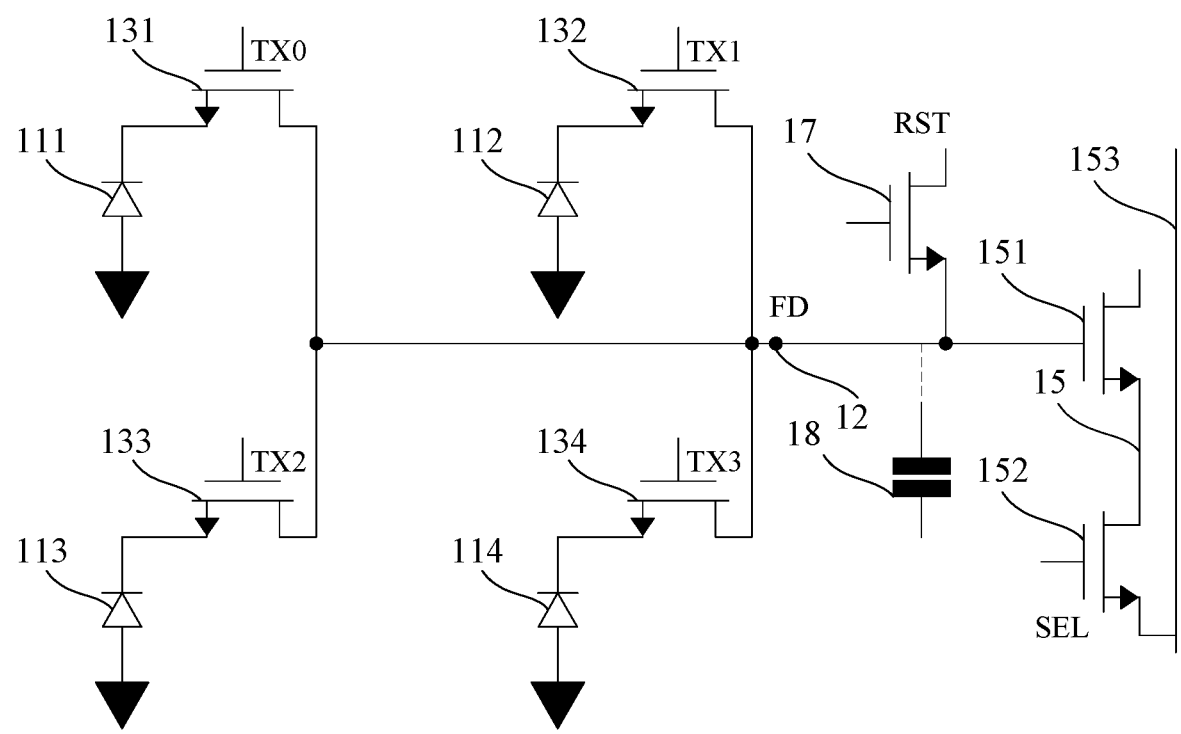
FIG. 4 a circuit diagram showing an image sensing circuit according to the first embodiment of the present invention.

Please refer to FIG. 3 and FIG. 4, FIG. 3 is a schematic view of the image sensing circuit according to the first embodiment of the present invention; FIG. 4 is a circuit diagram of the image sensing circuit according to the first embodiment of the present invention. As shown in FIG. 3 and FIG. 4, the image sensing circuit 100 according to the first embodiment of the present invention includes: a photodiode 11, a floating diffusion (FD) node 12, a transmission circuit 13, a control circuit 14, an amplification selection circuit 15, an image processing circuit 16, a reset circuit 17, a ramp circuit 18, an image frame buffer 19, and a control selection circuit 20.

Specifically, as shown in FIG. 3, the photodiode 11 according to the first embodiment of the present invention includes a first photodiode 111, a second photodiode 112, a third photodiode 113, and a fourth photodiode 114. It should be further explained that the photodiode 11 is mainly used to photoelectrically convert the incident light into a quantum charge (i.e., electrons) according to the light intensity of the incident light. In some embodiments, the first photodiode 111, the second photodiode 112, the third photodiode 113, and the fourth photodiode 114 may be photodiodes with the same structure, and the difference between each photodiodes is merely the exposure period of each photodiode being different, but the present invention is not limited thereto.

Specifically, as shown in FIG. 3, the FD node 12 according to the first embodiment of the present invention is coupled to the first photodiode 111, the second photodiode 112, the third photodiode 113, and the fourth photodiode 114. In some embodiments, the FD node 12 receives the charges accumulated by the first photodiode 111, the second photodiode 112, the third photodiode 113, and the fourth photodiode 114 to generate different voltages, but the present invention is not limited thereto.

Specifically, in some embodiments, the image sensing circuit 100 according to the first embodiment of the present invention may have one of a rolling shutter mechanism and a global shutter mechanism. It should be further explained that, in some embodiments, the present invention has at least four independent exposure control circuits to respectively control the photodiodes 11 to have different frame rates and different exposure periods, so it can be used with the rolling shutter mechanism to performs separate exposures, and finally performs image fusion through the image processing circuit 16 using the image frame buffer 19 to realize HDR image information, but the present invention is not limited thereto. The four independent exposure control circuits may each include address decoders to generate four independent frame rates and exposure timings, but the invention is not limited thereto. In particular, in FIG. 3, the image frame buffer 19 is coupled to the image processing circuit 16. However, the image frame buffer 19 may also be configured in the image processing circuit 16.

Specifically, as shown in FIG. 3, the transmission circuit 13 according to the first embodiment of the present invention is coupled to the photodiode 11, and the transmission circuit 13 includes a first transmission circuit 131, a second transmission circuit 132, a third transmission circuit 133, and a fourth transmission circuit 134, the first transmission circuit 131 is coupled to the first photodiode 111, the second transmission circuit 132 is coupled to the second photodiode 112, the third transmission circuit 133 is coupled to the third photodiode 113, and the fourth transmission circuit 134 is coupled to the fourth photodiode 114. More specifically, the transmission circuit 13 is coupled between the photodiode 11 and the FD node 12, and is controlled by a transmission signal TX to control the charge transmission between the photodiode 11 and the FD node 12, however, the present invention is not limited thereto.

Figure 6:
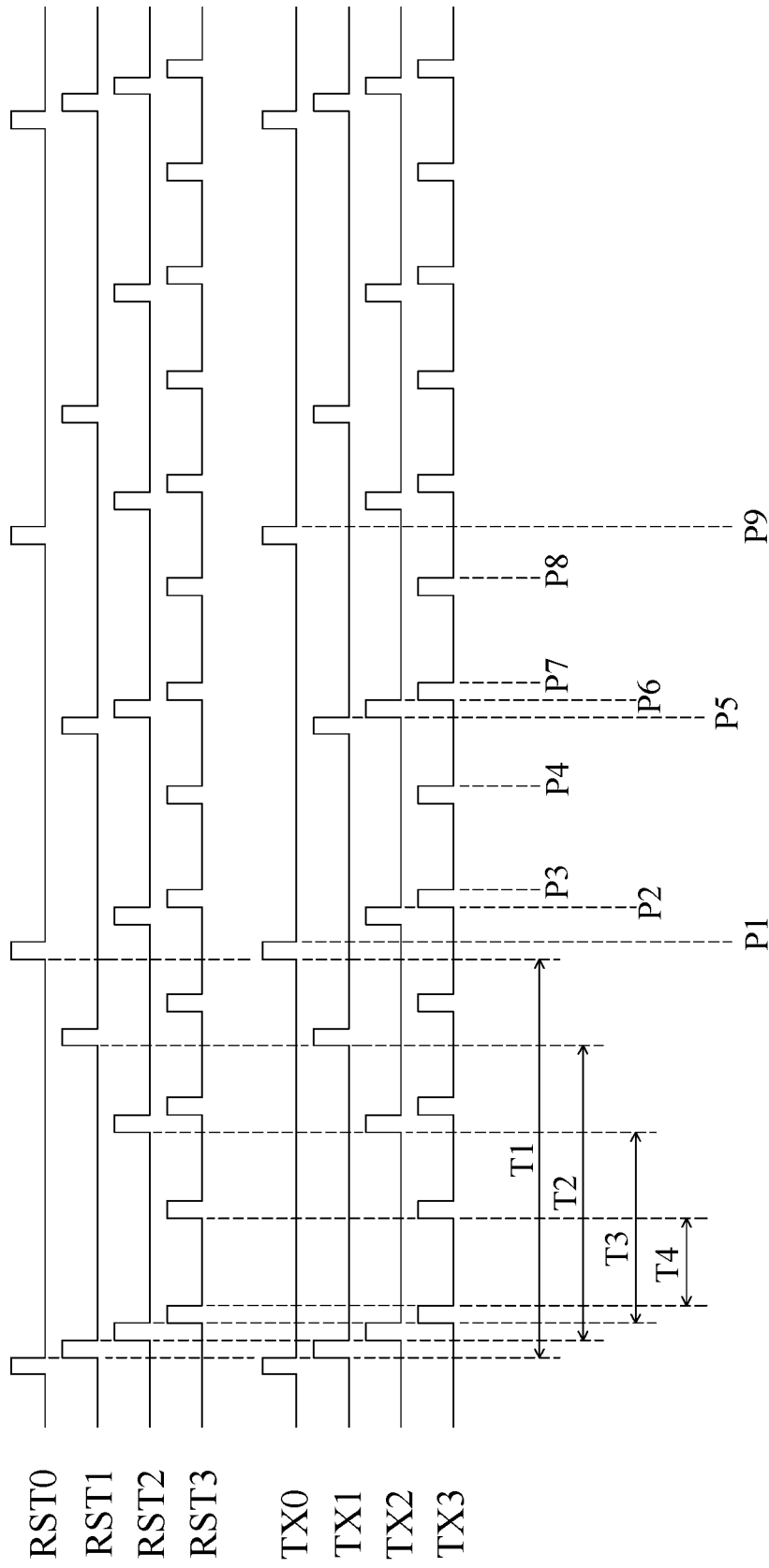
FIG. 6 is a timing diagram illustrating a reset signal and a transmission signal of an image sensing circuit according to the first embodiment of the present invention.

Specifically, as shown in FIGS. 3 and 4, the control circuit 14 according to the present invention is coupled to the transmission circuit 13. The control circuit 14 is used to generate a transmission signal TX and a reset signal RST. The control circuit 14 includes a first exposure control circuit 141, a second exposure control circuit 142, a third exposure control circuit 143, and a fourth exposure control circuit 144. The first exposure control circuit 141 is coupled to the transmission circuit 131 and controls the first photodiode 111 to expose at the first frame rate F1 for the first exposure period T1, the second exposure control circuit 142 is coupled to the second transmission circuit 132 and controls the second photodiode 112 to expose at a second frame rate F2 for a second exposure period T2, the third exposure control circuit 143 is used to control the third photodiode 113 to expose at a third frame rate F3 for a third exposure period T3, and the fourth exposure control circuit 144 is used to control the fourth photodiode 114 to expose at a fourth frame rate F4 for a fourth exposure period T4. In some embodiments, as shown in FIG. 6, each photodiode 11 has different exposure periods and different frame rates, wherein the first exposure period is four times the fourth exposure period, and the second exposure period is three times the fourth exposure period, and the third exposure period is twice the fourth exposure period, but the present invention is not limited thereto. It can be understood that the respective exposure periods can be independent and do not need to be a specific multiple, and users can choose the length of the respective exposure periods according to their needs. Each frame rate can be independent and does not need to be a specific multiple. Users can choose their own frame rate according to their needs.

Specifically, as shown in FIG. 3 and FIG. 4, the amplification selection circuit 15 according to the first embodiment of the present invention is coupled to the FD node 12 for converting the voltage of the FD node 12 into a voltage signal. In some embodiments, the voltage signal output by the amplification selection circuit 15 may include a plurality of first voltage signals, a plurality of second voltage signals, a plurality of third voltage signals, and a plurality of fourth voltage signals. The first voltage signals are generated by exposing the first photodiode 111 at the first frame rate F1 for the first exposure period T1, the second voltage signals are generated by exposing the second photodiode 112 at the second frame rate F2 for the second exposure period T2, the third voltage signals are generated by exposing the third photodiode 113 at the third frame rate F3 for the third exposure period T3, and the fourth voltage signals are generated by exposing the fourth photodiode 114 at the fourth frame rate F4 for the fourth exposure period T4, but the present invention is not limited thereto.

Specifically, as shown in FIG. 3 and FIG. 4, the image processing circuit 16 according to the first embodiment of the present invention is coupled to the amplification selection circuit 15. Wherein the image processing circuit 16 receives the voltage signal output by the amplification selection circuit 15, and processes the voltage signal to obtain corresponding pixel data. More specifically, in some embodiments, the image processing circuit 16 can be further coupled to an image frame buffer 19, the image frame buffer 19 is mainly used for storing pixel data, so as to respectively store multiple pieces of the pixel data corresponding to the first voltage signal, the second voltage signal, the third voltage signal and the fourth voltage signal, that is, the first sub-frame data, the second sub-frame data, and the third sub-frame data and the fourth sub-frame data, and then the image processing circuit 16 performs image fusion on these pixel data to generate a HDR full frame image signal. Wherein the image frame buffer 19 has a memory space for buffering at least one sub-frame.

Specifically, as shown in FIG. 3 and FIG. 4, the reset circuit 17 according to the first embodiment of the present invention is coupled to the FD node 12 and the control circuit 14, and the reset circuit 17 is used to reset the charge stored in the photodiode 11. In some embodiments, the reset circuit 17 receives the reset signal RST provided by the control circuit 14 to reset the charge stored in the first photodiode 111, the second photodiode 112, the third photodiode 113, and the fourth photodiode 114, respectively, and controls the first photodiode 111, the second photodiode 112, the third photodiode 113, and the four photodiodes 114 to expose at the first frame rate F1 for the first exposure period T1, expose at the second frame rate F2 for the second exposure period T2, expose at the third frame rate F3 for the third exposure period T3, and expose at the fourth frame rate F4 for the fourth exposure period T4, respectively, by using the transmission signal TX provided by the control circuit 14, but the present invention is not limited thereto. In this way, the present invention uses four independent exposure control circuits to provide the transmission signal TX and the reset signal RST to perform exposures of four different exposure lengths at four different frame rates, and utilize the image processing circuit 16 to use image frame buffer 19 to performs image fusion on the pixel data of the sub-frames to generate a real-time HDR full frame image signal. This overcomes the limitation that image fusion must be performed after each imaging operation, and allows image fusion to be performed during each imaging operation, so it can generate real-time HDR images in a short period of time, with better efficiency.

It should be further explained that, in this embodiment, as shown in FIG. 6, the first exposure period T1 has the longest length of time compared to other exposure periods. When the first photodiode 111 performs the exposure of the first exposure period T1, the second photodiode 112, the third photodiode 113, and the fourth photodiode 114 have already performed multiple exposures, and corresponding second voltage signals, third voltage signals, and fourth voltage signals were generated, so when the image processing circuit 16 generates pixel data corresponding to different voltage signals and performs image fusion, the image processing circuit 16 can perform image fusion to the first pixel data, the second pixel data, the third pixel data, and the fourth pixel data prior to the generation of the next frame of the first pixel data, that is, the time length for image fusion may be shorter than the first exposure period T1. It can be understood that since the image sensing circuit of the present invention performs image fusion, the length of time for image fusion is no longer limited to the longest exposure period, so the real-time HDR image signal after image fusion can be generated in a relatively short period of time, with high efficiency and wide applicability.

Specifically, as shown in FIG. 3 and FIG. 4, the transmission circuit 13 according to the first embodiment of the present invention may be a transistor, and the transistor is coupled between the cathode of the photodiode 11 and the FD node 12. When the transmission circuit 13 is brought into the on state by the transmission signal TX provided by the control circuit 14, the transmission circuit 13 transfer the charge accumulated in the photodiode 11 to the FD node 12 to generate a plurality of voltages, however the invention is not limited thereto.

Specifically, as shown in FIG. 3 and FIG. 4, the amplification selection circuit 15 according to the first embodiment of the present invention includes an amplification transistor 151, a selection transistor 152, and a signal line 153, wherein the gate of the amplification transistor 151 is coupled to the FD node 12, and the amplification transistor 151 is coupled to the signal line 153 via the selection transistor 152. When the selection transistor 152 receives the external selection signal SEL provided by the control selection circuit 20, the selection transistor 152 turns into the on state, the amplification transistor 151 amplifies the voltage of the FD node 12 and generates a voltage signal to be transmitted to the signal line 153, but the present invention is not limited thereto.

Specifically, as shown in FIG. 3 and FIG. 4, the ramp circuit 18 according to the first embodiment of the present invention is coupled to the FD node 12, and the ramp circuit 18 is used to adjust the voltage of the FD node 12, couple the ramp signal to the FD node 12, convert it into a digital pixel value and send it to the image processing circuit 16 after passing through the amplification circuit. It should be further noted that, in this embodiment, the ramp circuit 18 only includes one capacitor, which is coupled to the FD node 12, but the invention is not limited thereto.

Specifically, as shown in FIG. 3 and FIG. 4, the image frame buffer 19 according to the first embodiment of the present invention is coupled to the image processing circuit 16, and the image frame buffer 19 is mainly used for storing pixel data, in this embodiment, the image frame buffer 19 may be a digital frame buffer to respectively store the multiple pieces of the pixel data corresponding to the first voltage signals, the second voltage signals, the third voltage signals, and the fourth voltage signals, and then perform image fusion through the image processing circuit 16 to generate a HDR image signal, but the present invention is not limited thereto.

Figure 5:
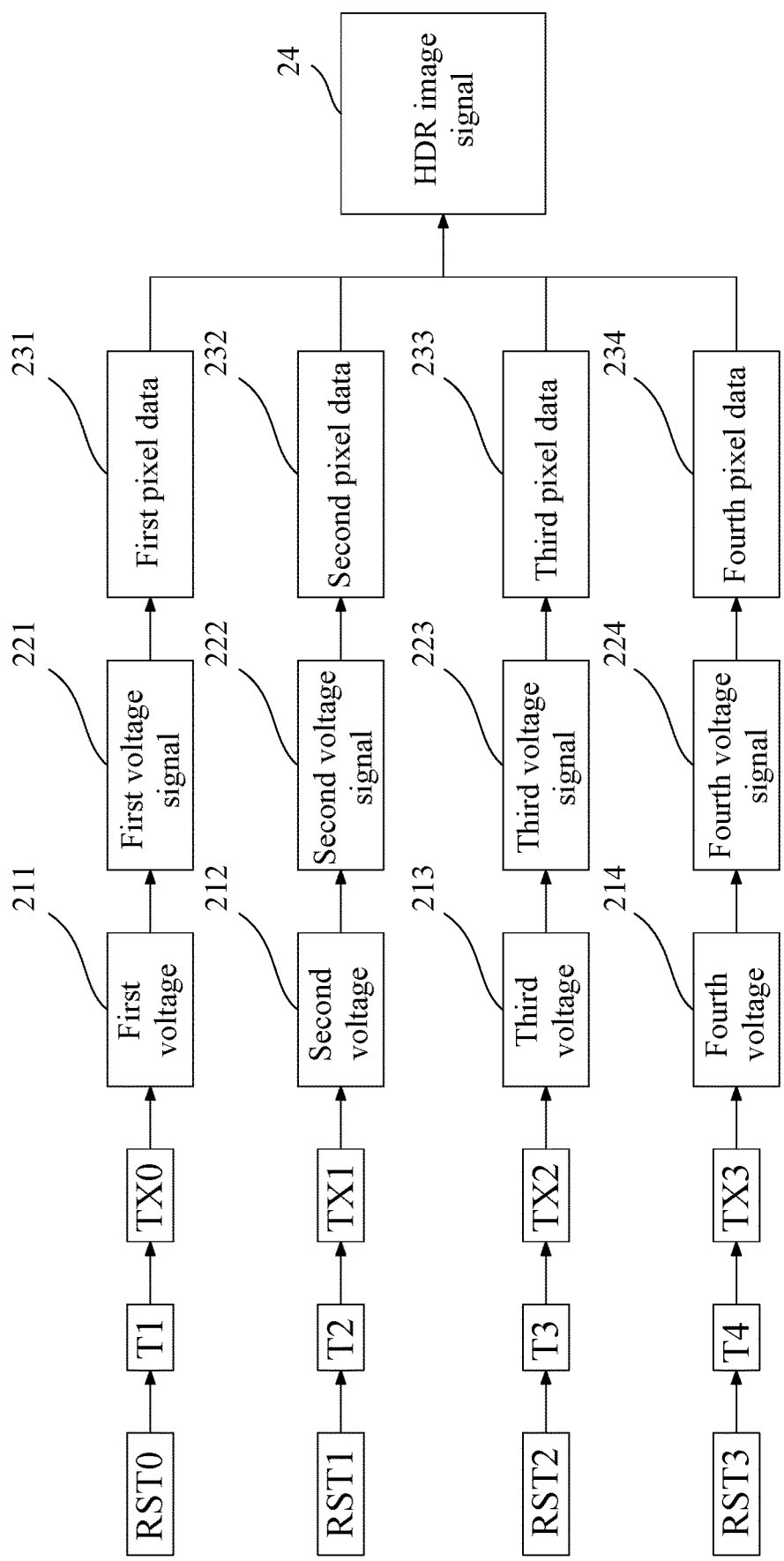
FIG. 5 is a schematic view illustrating the actual execution process of an image sensing circuit according to the present invention.

Please refer to FIG. 5 and FIG. 6. FIG. 5 is a schematic view illustrating the actual execution process of the image sensing circuit according to the present invention; FIG. 6 is a timing diagram illustrating a reset signal and a transmission signal of the image sensing circuit according to the first embodiment of the present invention. In this embodiment, the image sensing circuit 100 controls the exposure period of the photodiodes 11 through the transmission signal TX and the reset signal RST generated by the control circuit 14. As shown in FIG. 5 and FIG. 6, the actual implementation process of exposure according to the image sensing circuit 100 of the present invention is described as follows. Initially, the reset circuit 17 receives the first reset signal RST0 to reset the charge in the first photodiode 111, and the exposure starts in the first photodiode 111. Then, the reset circuit 17 receives the second reset signal RST1 to reset the charge in the second photodiode 112, and the exposure starts in the second photodiode 111. Then, the reset circuit 17 receives the third reset signal RST2 to reset the charge in the third photodiode 113, and the exposure starts in the third photodiode 113. Then, the reset circuit 17 receives the fourth reset signal RST3 to reset the charge in the fourth photodiode 114, and the exposure starts in the fourth photodiode 114. After resetting the charge in the fourth photodiode 114 and after the fourth exposure period T4 has passed, the fourth transmission circuit 134 receives the fourth transmission signal TX3, so that when the fourth transmission circuit 134 is in the on state, the fourth transmission circuit 134 transmits the charge accumulated in the fourth photodiode 114 to the FD node 12 to generate a fourth voltage 214. Then, the amplification selection circuit 15 receives the external selection signal SEL provided by the control selection circuit 20 to output a fourth voltage signal 224 according to the fourth voltage 214, and the fourth voltage signal 224 is generated by exposing the fourth photodiode 114 for the fourth exposure period T4. Then, the image processing circuit 16 generates a corresponding fourth pixel data 234 according to the fourth voltage signal 224, and stores it in the image frame buffer 19. After resetting the charge in the third photodiode 113 and after the third exposure period T3 has passed, the third transmission circuit 133 receives the third transmission signal TX2, so that when the third transmission circuit 133 is in the on state, the third transmission circuit 133 transmits the charge accumulated in the third photodiode 113 to the FD node 12 to generate a third voltage 213. Then, the amplification selection circuit 15 receives the external selection signal SEL provided by the control selection circuit 20 to output a third voltage signal 223 according to the third voltage 213, and the third voltage signal 223 is generated by exposing the third photodiode 113 for the third exposure period T3. Then, the image processing circuit 16 generates a corresponding third pixel data 233 according to the third voltage signal 223, and stores it in the image frame buffer 19. After resetting the charge in the second photodiode 112 and after the second exposure period T2 has passed, the second transmission circuit 132 receives the second transmission signal TX1, so that when the second transmission circuit 132 is in the on state, the second transmission circuit 132 transfers the charge accumulated in the second photodiode 112 to the FD node 12 to generate a second voltage 212. Then, the amplification selection circuit 15 receives the external selection signal SEL provided by the control selection circuit 20 to output the second voltage signal 222 according to the second voltage 212, the second voltage signal 222 is generated by exposing the second photodiode 112 for the second exposure period T2. Then, the image processing circuit 16 generates a corresponding second pixel data 232 according to the second voltage signal 222, and stores it in the image frame buffer 19. After resetting the charge in the first photodiode 111 and the first exposure period T1 has passed, the first transmission circuit 131 receives the first transmission signal TX0, so that when the first transmission circuit 131 is in the on state, the first transmission circuit 131 transfers the charge accumulated in the first photodiode 111 to the FD node 12 to generate a first voltage 211. Then, the amplification selection circuit 15 receives the external selection signal SEL provided by the control selection circuit 20, so as to output the first voltage signal 221 according to the first voltage 211, the first voltage signal 221 is generated by exposing the first photodiode 111 for the first exposure period T1. Then, the image processing circuit 16 generates a corresponding first pixel data 231 according to the first voltage signal 221, and stores it in the image frame buffer 19. Finally, the image processing circuit 16 uses the image frame buffer 19 to perform image fusion on the aforementioned pixel data to generate a HDR image signal 24. In particular, after the sub-frame with the longest exposure period has completed its first output, each time any sub-frame completes its output (for example, time points P1, P2, P3, P4, P5, P6, P7, P8, P9, etc.), image fusion can be performed to generate real-time HDR image signals. Although the image processing circuit 16 only obtains the data of an updated sub-frame at each time point, the output of the image fusion is a full frame by using the temporary storage data in the image frame buffer 19, and the update rate is greater than or equal to the frame rate of the fastest sub-frame instead of outputting the frame at the slowest frame rate.

Other examples of the image sensing circuit 100 are provided below, so that those skilled in the art of the present invention can more clearly understand possible changes. Components denoted by the same reference numerals as in the above embodiment are substantially the same as those described above with reference to FIGS. 1-6. The same components, features, and advantages as those of the image sensing circuit 100 will not be repeated.

Please refer to FIG. 7. FIG. 7 is a schematic view illustrating the exposure period of an image sensing circuit with HDR according to a second embodiment of the present invention. Compared with the first embodiment, the main difference of the second embodiment is that the first exposure period T1 of the second embodiment is equal to the second exposure period T2, and the third exposure period T3 is equal to the fourth exposure period T4. It can be understood that the user can arbitrarily control the photodiode 11 to expose the first exposure period T1, the second exposure period T2, the third exposure period T3, and the fourth exposure period T4 through the transmission signal TX and the reset signal RST generated by the control circuit 14, however the present invention is not limited thereto.

Figure 8:
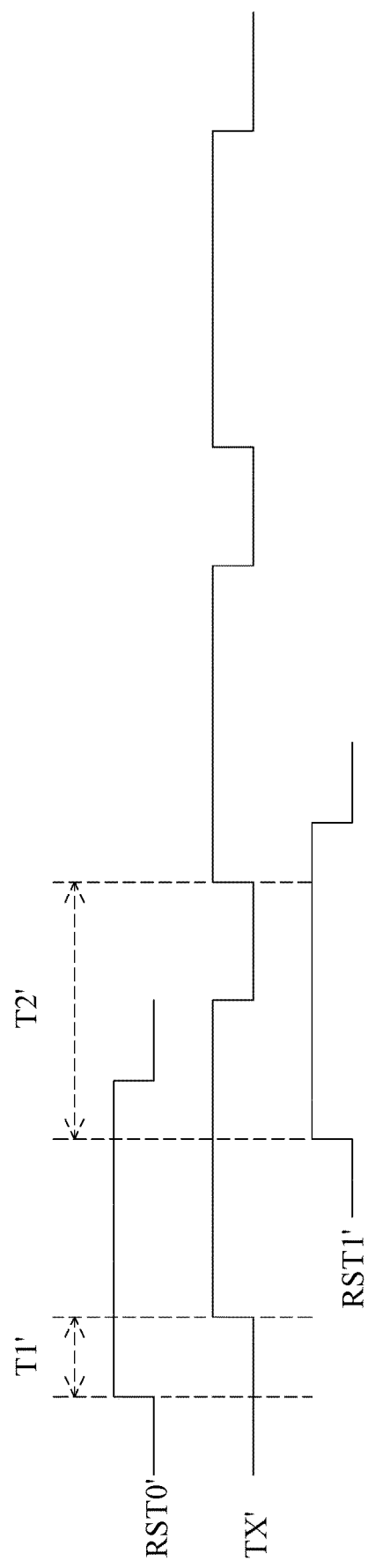
FIG. 8 is a partial timing diagram illustrating a reset signal and a transmission signal of an image sensing circuit according to a third embodiment of the present invention.

Please refer to FIG. 8. FIG. 8 is a partial timing diagram illustrating a reset signal and a transmission signal of an image sensing circuit according to a third embodiment of the present invention. Compared with the first embodiment, the main difference of the third embodiment is that the transmission signal TX' of the image sensing circuit 100 according to the third embodiment of the present invention has a fixed transmission frequency, that is, a fixed frame rate readout operation, at this time, the control circuit 14 must contain at least two exposure control circuits to control the exposure period of a single photodiode 11, as shown in FIG. 8, the control circuit 14 can generate a first reset signal RST0' and a second reset signal RST1' through the two independent exposure control circuits to adjust the photodiode 11 to generate a first exposure period T1' and a second exposure period T2'. It can be understood that the user can control the exposure period of the photodiode 11 through the transmission signal TX', the first reset signal RST0', and the second reset signal RST1' generated by the control circuit 14, but the invention is not limited thereto. Here, RST0', RST1', and TX' all represent intervals. RST0' represents the interval of the set of sequentially appeared reset signals of all rows in the same frame in the first exposure period T1'. RST1' represents the interval of the set of sequentially appeared reset signals of all rows in the same frame in the second exposure period T2'. TX' represents the interval of the set of sequentially appeared readouts of all rows in the same frame.

It can be understood that those skilled in the technical field of the present invention can make various changes and adjustments based on the above examples, which will not be listed one by one here. The following will focus on implementing the image sensing device according to the embodiment.

Figure 9:
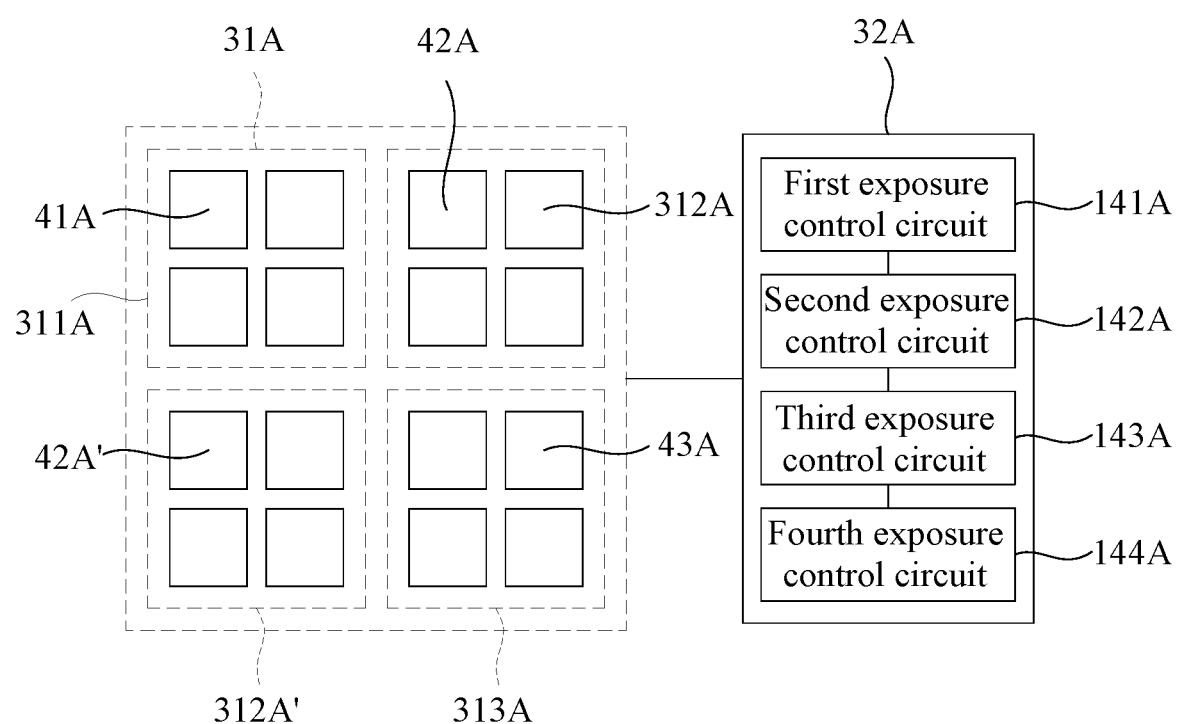
FIG. 9 is a schematic view of an image sensing device according to the present invention.
Figure 10:
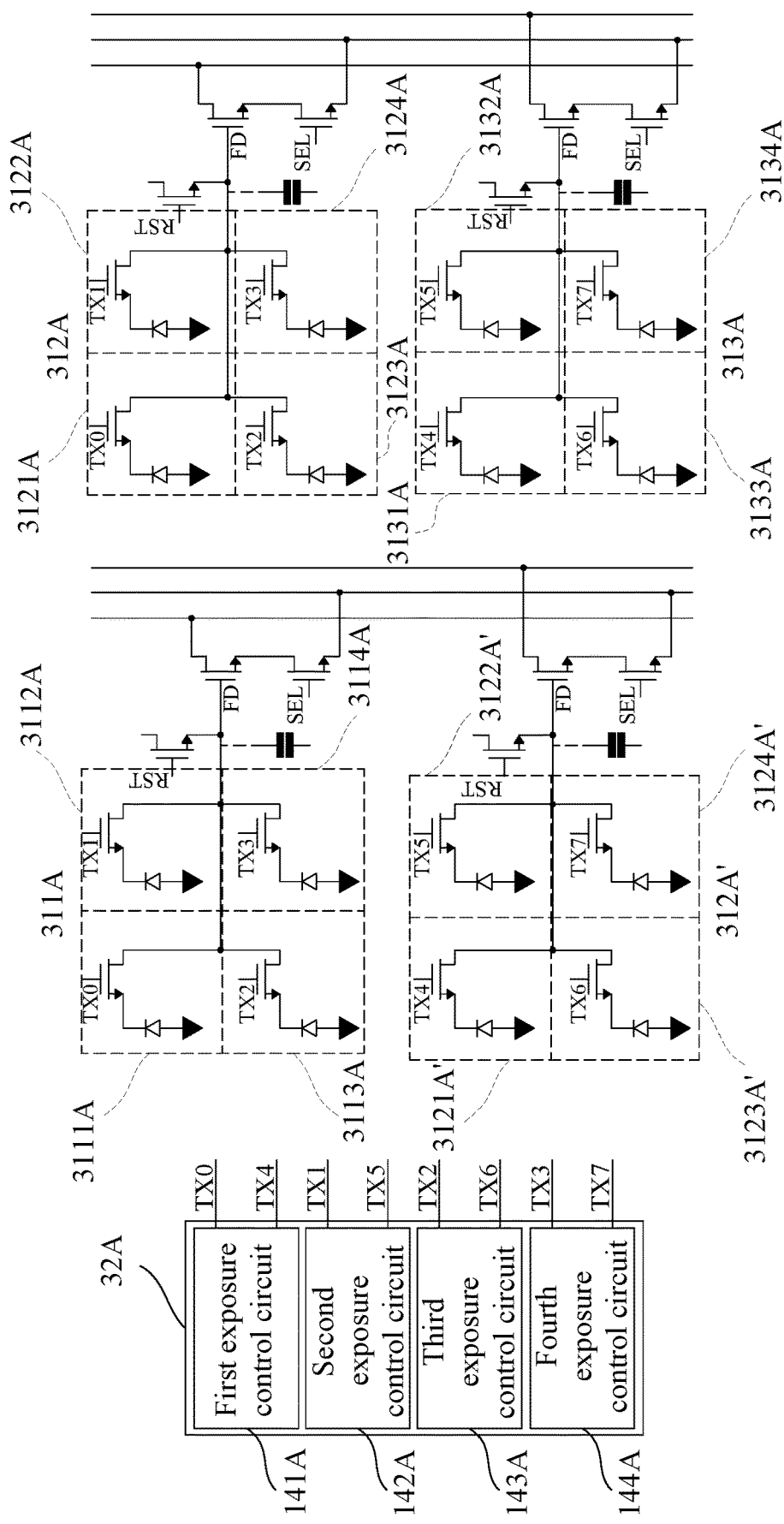
FIG. 10 is a circuit diagram of an image sensing device according to the present invention.
Figure 11:
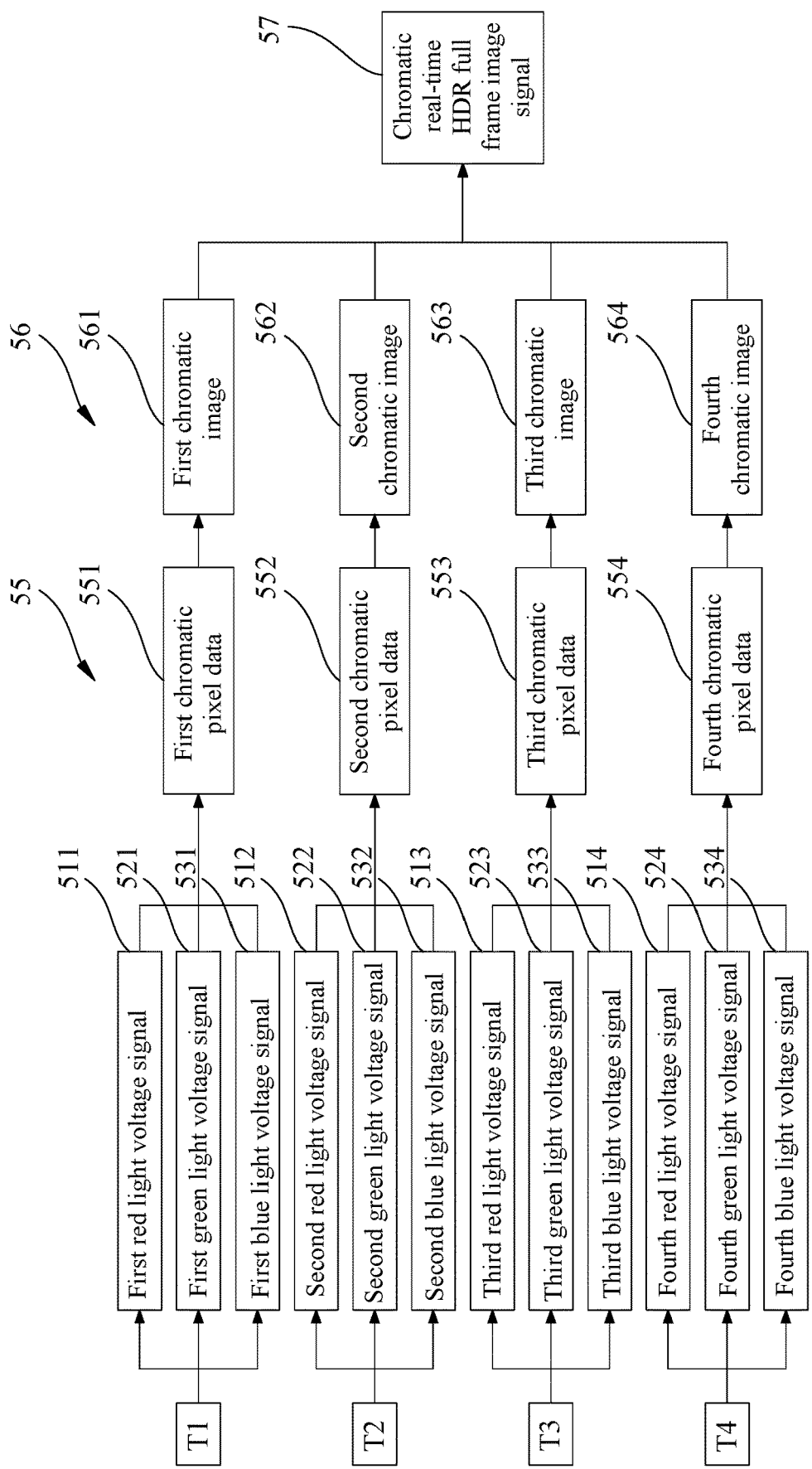
FIG. 11 is a schematic view illustrating the actual execution process of an image sensing device according to the present invention.

Please refer to FIGS. 9-11. FIG. 9 is a schematic view of an image sensing device according to the present invention; FIG. 10 is a circuit diagram of an image sensing device according to the present invention; FIG. 11 is a schematic view illustrating the actual execution process of an image sensing device according to the present invention. As shown in FIG. 9, an image sensing device 300A according to the present invention includes: an image sensing array 31A and an exposure control circuit 32A.

Specifically, the image sensing array according to the present invention may include a red light pixel group 311A, a green light pixel group 312A, a blue light pixel group 313A, and a green light pixel group 312A'. These pixel groups are used to generate the pixel data according to different frame rates and different exposure periods through the exposure control circuit 32A during the image capturing operation, and the image signals 24 are generated by image fusion of the pixel data. As shown in FIG. 10, the red light pixel group 311A, the green light pixel group 312A, the blue light pixel group 313A, and the green light pixel group 312A' all include the above-mentioned image sensing circuit 100. More specifically, the red light pixel group 311A of the present invention includes a first red light sensing unit 3111A, a second red light sensing unit 3112A, a third red light sensing unit 3113A, and a fourth red light sensing unit 3114A; the green light pixel group 312A of the present invention, it includes a first green light sensing unit 3121A, a second green light sensing unit 3122A, a third green light sensing unit 3123A, and a fourth green light sensing unit 3124A; the blue light pixel group 313A of the present invention includes a first blue light sensing unit 3131A, a second blue light sensing unit 3132A, a third blue light sensing unit 3133A, and a fourth blue light sensing unit 3134A; the green light pixel group 312A' of the present invention includes a first green light sensing unit 3121A', a second green light sensing unit 3122A', a third green light sensing unit 3123A' and a fourth green light sensing unit 3124A'. Thus, the image sensing device 300A of the present invention can generate HDR image signals in the visible light wavelength range. In particular, in this embodiment, each pixel group includes four sensing units with the same sensing wavelength range, and these four sensing units can generate four different pixel data. The image processing circuit can perform real-time image fusion of the four images at this wavelength through the image frame buffer to generate a real-time HDR image at this wavelength. By combining the images of the four pixel groups, a chromatic real-time HDR image can be generated.

Specifically, as shown in FIG. 9, the image sensing device 300A according to the present invention includes a red light filter 41A, green light filters 42A, 42A', and a blue light filter 43A. The red light filter 41A is configured on the red light pixel group 311A, the green light filters 42A, 42A' are respectively configured on the green light pixel groups 312A, 312A', and the blue light filter 43A is configured on the blue light pixel group 313A. Thereby, by adding the red light filter 41A, the green light filter 42A, 42A', and the blue light filter 43A, the image sensing device 300A according to the present invention can allow the same photodiode to detect different wavelength ranges, and achieve the purpose of generating chromatic HDR image information, greatly improving the practicability and scope of application of the image sensing device 300A of the present invention.

Specifically, as shown in FIGS. 9-11, the exposure control circuit 32A according to the present invention has a first exposure control circuit 141A, a second exposure control circuit 142A, a third exposure control circuit 143A, and a fourth exposure control circuit 144A, wherein the exposure control circuit 32A is mainly used to control the red light pixel group 311A, the green light pixel groups 312A, 312A' and the blue light pixel group 313A to expose at different frame rates for different exposure periods. More specifically, in this embodiment, the first exposure control circuit 141A is coupled to the first red light sensing unit 3111A, the first green light sensing unit 3121A, the first blue light sensing unit 3131A, and the first green light sensing unit 3121A', the second exposure control circuit 142A is coupled to the second red light sensing unit 3112A, the second green light sensing unit 3122A, the second blue light sensing unit 3132A, and the second green light sensing unit 3122A', the third exposure control circuit 143A is coupled to the third red light sensing unit 3113A, the third green light sensing unit 3123A, the third blue light sensing unit 3133A and the third green light sensing unit 3123A', the fourth exposure control circuit 144A is coupled to the fourth red light sensing unit 3114A, the fourth green light sensing unit 3124A, the fourth blue light sensing unit 3134A, and the fourth green light sensing unit 3124A'. In this way, the first exposure control circuit 141A controls the first red light sensing unit 3111A, the first green light sensing unit 3121A, the first blue light sensing unit 3131A, and the first green light sensing unit 3121A' to expose at the first frame rate F1 for the first exposure period T1, the second exposure control circuit 142A controls the second red light sensing unit 3112A, the second green light sensing unit 3122A, the second blue light sensing unit 3132A, and the second green light sensing unit 3122A' to expose at the second frame rate F2 for the second exposure period T2, the third exposure control circuit 143A controls the third red light sensing unit 3113A, the third green light sensing unit 3123A, the third blue light sensing unit 3133A, and the third green light sensing unit 3123A' to expose at the third frame rate F3 for the third exposure period T3, and the fourth exposure control circuit 144A controls the fourth red light sensing unit 3114A, the fourth green light sensing unit 3124A, the fourth blue light sensing unit 3134A, and the fourth green light sensing unit 3124A' to expose at the fourth frame rate F4 for the fourth exposure period T4, but the present invention is not limited thereto.

It can be understood that, as shown in FIG. 11, the red light pixel group 311A, the green pixel groups 312A, 312A', and the blue pixel group 313A respectively generate voltage signals at different frame rates for different exposure periods. Among them, the red light pixel group 311A generates the first red light voltage signal 511 exposing at the first frame rate F1 for the first exposure period T1, the second red light voltage signal 512 exposing at the second frame rate F2 for the second exposure period T2, the third red light voltage signal 513 exposing at the third frame rate F3 for the third exposure period T3, and the fourth red light voltage signal 514 exposing at the fourth frame rate F4 for the fourth exposure period T4. The green light pixel groups 312A, 312A' generate the first green light voltage signal 521 exposing at the first frame rate F1 for the first exposure period T1, the second green light voltage signal 522 exposing at the second frame rate F2 for the second exposure period T2, the third green light voltage signal 523 exposing at the third frame rate F3 for the third exposure period T3, and the fourth green light voltage signal 524 exposing at the fourth frame rate F4 for the fourth exposure period T4. The blue pixel group 313A generate the first blue light voltage signal 531 exposing at the first frame rate F1 for the first exposure period T1, the second blue light voltage signal 532 exposing at the second frame rate F2 for the second exposure period T2, the third blue light voltage signal 533 exposing at the third frame rate F3 for the third exposure period T3, and the fourth blue light voltage signal 534 exposing at the fourth frame rate F4 for the fourth exposure period T4, and the image processing circuit 16 generates corresponding first chromatic pixel data 551, second chromatic pixel data 552, third chromatic pixel data 553, and fourth chromatic pixel data 554 according to these voltage signals, and generate a first chromatic image 561, a second chromatic image 562, a third chromatic image 563, and a fourth chromatic image 564 according to chromatic pixel data 55, so as to perform image fusion on chromatic images 56 to generate a chromatic HDR image signal 57.

Thus, it can be seen from the above description that the image sensing device 300A according to the present invention uses the exposure control circuit 32A, and the exposure control circuit 32A includes the first exposure control circuit 141A, the second exposure control circuit 142A, the third exposure control circuit 143A, and the fourth exposure control circuit 144A are used to respectively control the red pixel group 311A, the green pixel group 312A, the blue pixel group 313A, and the green pixel group 312A' to generate voltage signals of different wavelength ranges, and generate corresponding chromatic pixel data 55 and chromatic images 56 according to the voltage signals using the image processing circuit 16, and the image processing circuit 16 can independently generate multiple chromatic images 56, or perform image fusion of multiple chromatic images 56 through the image frame buffer to generate chromatic HDR image signals 57. In this way, the present invention uses four different frame rates to perform four exposures with different exposure periods, and through the image processing circuit 16, perform image fusion on the pixel data of the four sub-frames to generate a real-time full frame image signal with HDR. This overcomes the limitation that image fusion must be performed after each image capturing operation, it can be performed during each image capturing operation, so HDR images can be generated in a short period of time, with better efficiency. And through the filters of different wavelengths, the red pixel group 311A, the green pixel group 312A, the blue pixel group 313A, and the green pixel group 312A' can generate voltage signals of different wavelength ranges, realizing real-time chromatic HDR full frame image signal 57.

Figure 12:
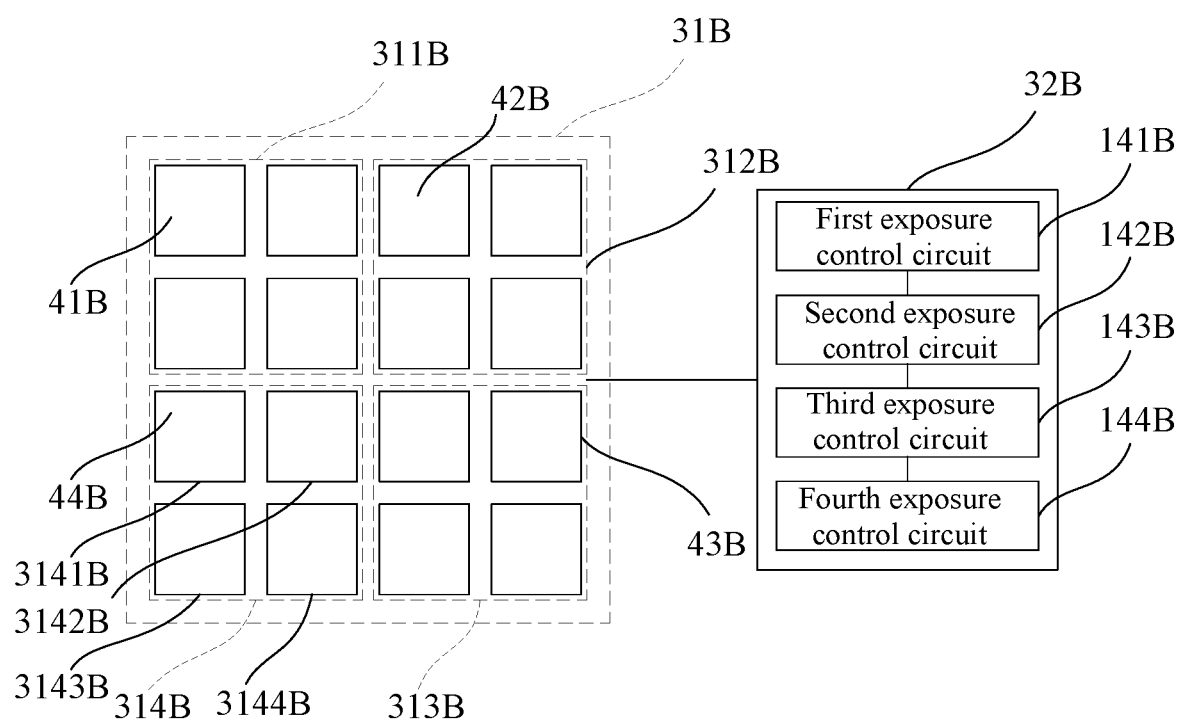
FIG. 12 is another schematic view of an image sensing device according to the present invention.
Figure 13:
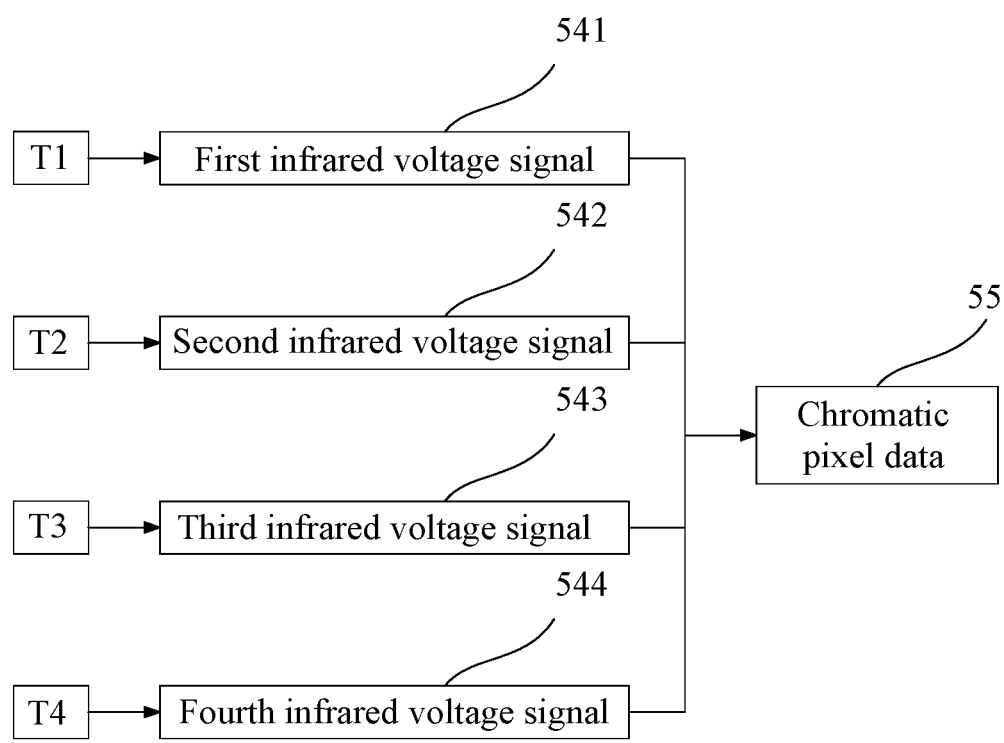
FIG. 13 is a schematic view illustrating the actual execution process of another image sensing device according to the present invention.

Please refer to FIGS. 12-13. FIG. 12 is another schematic view of an image sensing device according to the present invention; FIG. 13 is a schematic view illustrating an actual implementation process of another image sensing device according to the present invention. Similar elements are described in the previous embodiments and will not be repeated here. As shown in FIG. 12, in other embodiments, the image sensing device 300B of the present invention may further include an infrared pixel group 314B, an infrared filter 44B is arranged on the infrared pixel group 314B, and the infrared pixel group 314B includes a first infrared sensing unit 3141B, a second infrared sensing unit 3142B, a third infrared sensing unit 3143B, and a fourth infrared sensing unit 3144B, and the first exposure control circuit 141B is coupled to the first infrared sensing unit 3141B, the second exposure control circuit 142B is coupled to the second infrared sensing unit 3142B, the third exposure control circuit 143B is coupled to the third infrared sensing unit 3143B and the fourth exposure control circuit 144A is coupled to the fourth infrared sensing unit 3144B.

Specifically, as shown in FIGS. 12-13, the exposure control circuit 32B according to the present invention has a first exposure control circuit 141B, a second exposure control circuit 142B, a third exposure control circuit 143B, and a fourth exposure control circuit 144B, wherein the first exposure control circuit 141B controls the first infrared sensing unit 3141B to expose at the first frame rate F1 for the first exposure period T1, the second exposure control circuit 142B controls the second infrared sensing unit 3142B to expose at the second frame rate F2 for the second exposure period T2, the third exposure control circuit 143B controls the third infrared sensing unit 3143B to expose at the third frame rate F3 for the third exposure period T3, and the fourth exposure control circuit 144B controls the fourth infrared sensing unit 3144B to expose at the fourth frame rate F4 for the fourth exposure period T4, so that the infrared pixel group 314B generates a first infrared voltage signal 541, a second infrared voltage signal 542, a third infrared voltage signal 543, and a fourth infrared voltage signal 544, and generate corresponding chromatic pixel data 55.

In this way, the present invention performs image sensing in the infrared wavelength range through the infrared pixel group 314B, so that the image sensing device 300 of the present invention can be applied in a low-brightness environment, greatly improving the applicability of the image sensing device 300 of the present invention.

Figure 14:
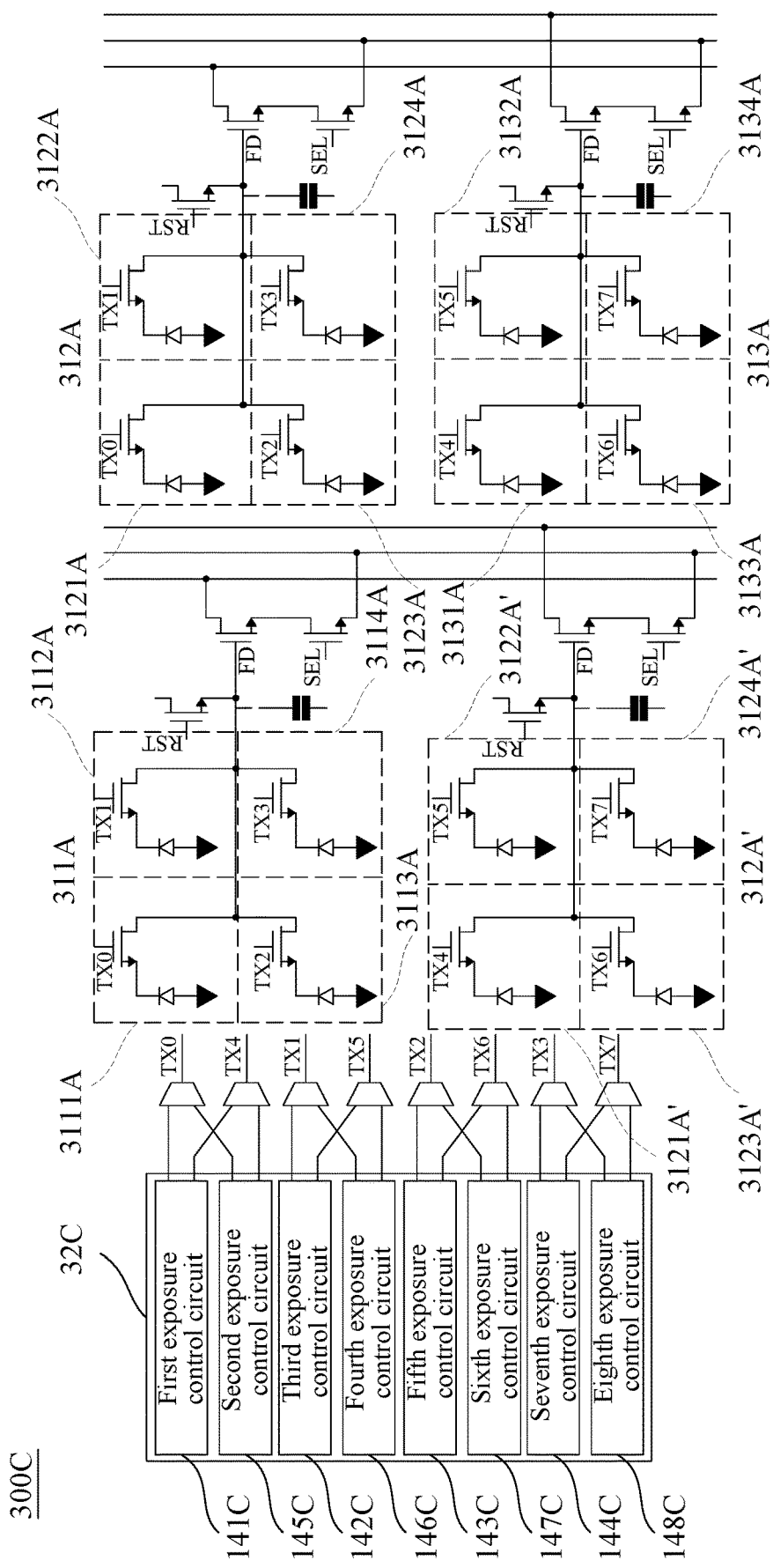
FIG. 14 is another schematic view of an image sensing device according to the present invention.

Please refer to FIG. 14, which is another schematic view of an image sensing device according to the present invention. Similar elements are described in the previous embodiments and will not be repeated here. As shown in FIG. 14, in other embodiments, the image sensing device 300C according to the present invention may have the image sensing circuit of the third embodiment as described above. When the transmission signal TX' has a fixed transmission frequency, that is, a fixed frame rate during the readout operation, the control circuit 14B must include at least two exposure control circuits to control the exposure period of a single photodiode 11. Therefore, compared with the first embodiment, the exposure control circuit 32C can further include a fifth exposure control circuit 145C, a sixth exposure control circuit 146C, a seventh exposure control circuit 147C, and an eighth exposure control circuit 148C, so that the red light pixel group 311C, the green light pixel group 312C, 312C' and the blue light pixel group 313C generate voltage signals with different exposure periods, respectively. Thus, the image sensing device 300C according to the present invention can be applied in a fixed frame rate environment by increasing the number of independent exposure control circuits, so that the image sensing device 300C of the present invention has a wide range of applicability and other effects, but the present invention is not limited thereto.

The above description is to illustrate the implementation of the present invention by means of specific examples. Those skilled in the art can easily understand other advantages and effects of the present invention from the contents disclosed in this specification.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. An image sensing device, comprising:
an image sensing array including a plurality of sensing units, the sensing units respectively generating multiple pieces of pixel data, and the multiple pieces of pixel data being generated according to different frame rates under different exposure periods; and an image processing circuit coupled to the image sensing array, wherein the multiple pieces of pixel data includes a first pixel data of a first sub-frame and a second pixel data of a second sub-frame, and the first pixel data is generated by exposing at a first frame rate for a first exposure period, the second pixel data is generated by exposing at a second frame rate for a second exposure period, the first frame rate is less than the second frame rate, and the first exposure period is greater than the second exposure period, and multiple pieces of the second pixel data are generated during one image capturing operation performed by the image processing circuit, wherein the sensing units are divided into a plurality of pixel groups, wherein the pixel groups are used to generate a high dynamic range image signal by using the image processing circuit to perform image fusion on the multiple pieces of pixel data according to the different frame rates under the different exposure periods in multiple image capturing operations, wherein the sensing units include a control circuit, and the control circuit includes:

a first exposure control circuit for generating a first transmission signal and a first reset signal; and a second exposure control circuit for generating a second transmission signal and a second reset signal, and wherein the first exposure control circuit and the second exposure control circuit are independent, and are used to respectively control the different frame rates and the different exposure periods.

2. The image sensing device according to claim 1, wherein the fusion and output of the high dynamic range image signal are carried out in each image capturing operation, so as to output the high dynamic range image signal as a chromatic high dynamic range image with full resolution, and wherein the high dynamic range image signal is output at a rate greater than or equal to the second frame rate.

3. The image sensing device according to claim 1, wherein the first exposure period is longer than one frame length of the second sub-frame.

4. The image sensing device according to claim 1, wherein the sensing units respectively include:

a photodiode;

a transmission circuit coupled to the photodiode; and a reset circuit coupled to the photodiode, wherein the reset circuit is used to receive a reset signal, and the transmission circuit is used to receive a transmission signal, the reset circuit resets the charge in the photodiode according to the reset signal, and the transmission circuit converts the charge accumulated in the photodiode into sensing signal according to the transmission signal.

5. The image sensing device according to claim 4, wherein at least a portion of the sensing units is a first sensing unit, the reset circuit of the first sensing unit receives the first reset signal, and the transmission circuit of the first sensing unit receives the first transmission signal, and the time difference between the first reset signal and the first transmission signal is the first exposure period.

6. The image sensing device according to claim 5, wherein the sensing units of different pixel groups have the same first exposure period.

7. The image sensing device according to claim 5, wherein the sensing units of different pixel groups have the same second exposure period.

8. The image sensing device according to claim 4, wherein at least a portion of the sensing units is a second sensing unit, the reset circuit of the second sensing unit receives the second reset signal, the transmission circuit of the second sensing unit receives the second transmission signal, and the timing of the second reset signal and the second transmission signal is between the first reset signal and the transmission signal.

9. The image sensing device according to claim 8, wherein the time difference between the second reset signal and the second transmission signal for each of the sensing units is the second exposure period.

10. The image sensing device according to claim 4, wherein the control circuit is coupled to the transmission circuit and the reset circuit, and the control circuit is used to generate the transmission signals and the reset signals.

11. The image sensing device according to claim 1, wherein the pixel groups include a red light pixel group, a green light pixel group and a blue light pixel group, the red light pixel group, the green light pixel group, and the blue light pixel group respectively include more than two sensing units with different frame rates and different exposure periods, so that the image processing circuit outputs the high dynamic range image signal after performing fusion on pixel data with different color respectively generated by the pixel groups.

12. The image sensing device according to claim 11, further comprising a plurality of filters, the filters include a red light filter, a green light filter and a blue light filter, the red light filter, the green light filter, and the blue light filter are correspondingly arranged on the sensing units of the red light pixel group, the green light pixel group, and the blue light pixel group.

13. The image sensing device according to claim 11, wherein the pixel groups further include an infrared pixel group, and the image processing circuit outputs infrared image information according to image information generated by the infrared pixel group.

14. The image sensing device according to claim 13, further comprising an infrared filter, the infrared filter is correspondingly disposed on the sensing units of the infrared pixel group.

15. The image sensing device according to claim 1, further comprising an image frame buffer, which is coupled to the image processing circuit, and the image frame buffer is used to store the pixel data of at least one sub-frame, so as to be used for image fusion.

* * * * *